United States Patent
Ko et al.

[11] Patent Number: 5,926,069
[45] Date of Patent: Jul. 20, 1999

[54] LOW NOISE AMPLIFIER

[75] Inventors: Beom-Kyu Ko; Kwy-Ro Lee, both of Taejeon-Kwangyokshi, Rep. of Korea

[73] Assignee: Samsung Electronics, Co. Ltd., Suwon, Rep. of Korea

[21] Appl. No.: 08/822,851

[22] Filed: Mar. 24, 1997

[30] Foreign Application Priority Data

Mar. 28, 1996 [KR] Rep. of Korea .......................... 96-8865
Jun. 3, 1996 [KR] Rep. of Korea ....................... 96-19694

[51] Int. Cl.⁶ ............................. H03F 3/191; H03F 3/193
[52] U.S. Cl. ........................... 330/302; 330/294; 330/311
[58] Field of Search .................................... 330/277, 294, 330/302, 310, 311

[56] References Cited

U.S. PATENT DOCUMENTS

| | | | |
|---|---|---|---|
| 4,112,386 | 9/1978 | Everhart et al. ................. | 330/311 X |
| 4,342,967 | 8/1982 | Regan et al. .................... | 330/311 X |
| 4,658,220 | 4/1987 | Heston et al. ................... | 330/311 X |
| 5,015,968 | 5/1991 | Podell et al. ................... | 330/294 X |

FOREIGN PATENT DOCUMENTS 197708   8/1977   U.S.S.R. ................. 330/294

*Primary Examiner*—Steven Mottola
*Attorney, Agent, or Firm*—Marger Johnson & McCollom, P.C.

[57] ABSTRACT

A low noise amplifier includes an input matching means of an input stage and an output matching means of an output stage, a common source transistor and a common gate transistor serially connected between the input matching means and the output matching means, a first inductor connected between said common source transistor and common gate transistor a second inductor connected between the common point of said common source transistor and common gate transistor and the output stage of said common gate transistor. Therefore, the low noise amplifier allows the points of $\Gamma_{opt}$ and $G_{max}$ to be closer to each other so that the noise and input gain simultaneous matching is performed, thereby improving the performance.

3 Claims, 11 Drawing Sheets

LOW NOISE AMPLIFIER

BACKGROUND OF THE INVENTION

1. Field of the Invention

The present invention relates to a low noise amplifier, and more particularly to an improved low noise amplifier.

2. Description of the Prior Art

Figure 1:
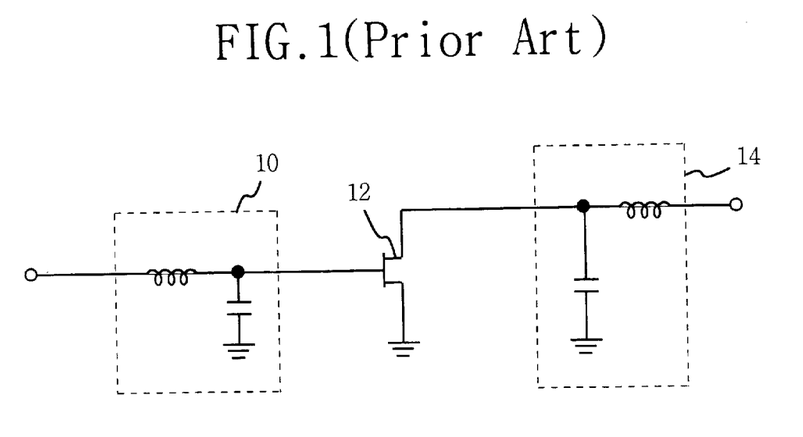
FIG. 1 is a circuit diagram of a conventional low noise amplifier.

FIG. 1 is a circuit diagram of a conventional low noise amplifier, which includes input/output matching circuits 10 and 14 and an active device 12.

The noise figure of the low noise amplifier shown in FIG. 1 is expressed in the following relationship:

$$NF = NF_{min} + \frac{4R_n |\Gamma_s - \Gamma_{opt}|^2}{(1-|\Gamma_s|^2)|1+\Gamma_{opt}|^2} \quad (1)$$

where $NF_{min}$ represents a minimum noise figure, $R_n$ represents a normalized noise resistance, $\Gamma_{opt}$ represents an optimum noise matching source reflectivity, and $\Gamma_s$ represents a source reflectivity, respectively. These figures are known as noise parameters and may be determined experimentally. Also, NF is a function of $\Gamma_s$. In order to obtain NFmin, $\Gamma_s$ and rpt should be equal to $\Gamma_{opt}$. This matching procedure is called a noise matching.

Next, let us consider the power gain of the microwave. There are several gain definitions in the microwave amplifier. Considering a finite $S_{12}$ of an active device 12 which is quite useful in the microwave frequencies the useful power gain concept for the design of the input match network of the microwave amplifiers is the available power gain $G_A$, which is the ratio of the power available from the source to the power available from the network. This is given by $$G_A = \frac{1-|\Gamma_s|^2}{|1-S_{11}\Gamma_{opt}|^2} |S_{21}|^2 \frac{1}{1-|\Gamma_{out}|^2} \quad (2)$$

$$\Gamma_{out} = S_{22} + \frac{S_{12}S_{21}\Gamma_s}{1-S_{11}\Gamma_s} \quad (3)$$

where $G_A$ is not a function of the load reflectivity $\Gamma_L$ but a function of $\Gamma_s$ and S parameter of the active device 12. Thus, the process for obtaining the maximum $\Gamma_s$ and $G_A$ is called an input power matching.

An output matching circuit 14 of the low noise amplifier can be devised using an operative power gain concept defined by the following equations:

$$G_P = \frac{1}{1-|\Gamma_{IN}|^2} S_{21}^2 \frac{1-|\Gamma_L|^2}{|1-S_{22}\Gamma_L|^2} \quad (4)$$

$$\Gamma_{IN} = S_{11} + \frac{S_{12}S_{21}\Gamma_L}{1-S_{22}\Gamma_L} \quad (5)$$

where $G_P$ is not a function of $\Gamma_s$ but a function of $\Gamma_L$ and S parameters of the active device 12. Thus, the process for obtaining the maximum $\Gamma_L$ and $G_P$ is called an output power matching, to which a general matching technique may be adopted.

Now, let us consider the stability of the microwave amplifiers. The necessary and sufficient conditions for unconditional stability are given in the following equations:

$$K = \frac{1-|S_{11}|^2-|S_{22}|^2+|\Delta|^2}{2|S_{12}S_{21}|} > 1 \quad (6)$$

$$B_1 = 1+|S_{11}|^2-|S_{22}|^2-|\Delta|^2 > 0 \quad (7)$$

where $\Delta = S_{21}S_{22}-S_{12}S_{21}$.

When a stability factor K of the active device is bigger than 1 the input/output power matching can be obtained but when a stability factor K of the active device is smaller than 1, we cannot have an indefinite matching. This is because the power matching points are placed at an unstable area, which is very usual for the microwave amplifiers. Therefore, the stability procedure is highly required for the power matching. A partially stable or unstable active device can be stabilized by using a loading or feedback technique in an input (or output) stage.

However, an additive stabilizer can considerably reduce the noise performance. Thus, in designing a microwave low noise amplifier, a stabilizing circuit should be carefully selected to avoid undesired addition of noise which may be caused by adding the stabilizer.

In designing the low noise amplifier with the common source single gate electric field effect transistor (or common gate bipolar junction transistor), it is well known that the noise matching for accomplishing $NF_{min}$ is caused by the voltage standing wave ratio (VSWR) or vice versa. This is because the optimum noise matching source reflectivity $\Gamma_{opt}$ is quite different from the maximum available power gain matching source reflectivity $G_{max}$. Therefore, if the noise matching is performed, the input power matching is not achieved, or vice versa. Thus, it is required to compromise factors among NF, power gain and input VSWR.

However, if $\Gamma_{opt}$ and $G_{max}$ are able to be matched, then $NF_{min}$, the maximum available power gain and low input VSWR are simultaneously achieved. This is called a noise and input power simultaneous matching.

SUMMARY OF THE INVENTION

It is an object of the present invention to provide a low noise amplifier which can perform a noise and input power simultaneousness matching by matching $\Gamma_{opt}$ and $G_{max}$.

To accomplish the above object, according to a first aspect of the present invention, there is provided a low noise amplifier comprising: an input matching means of an input stage and an output matching means of an output stage; a common source transistor and a common gate transistor serially connected between the input matching means and the output matching means; and a feedback resistor connected between the input matching means and the output matching means.

According to a second aspect of the present invention, there is provided a low noise amplifier comprising: an input matching means of an input stage and an output matching means of an output stage; a common gate transistor connected between the input matching means and the output matching means; and a feedback inductor connected between the input matching means and the output matching means.

According to a third aspect of the present invention, there is provided a low noise amplifier comprising: an input matching means of an input stage and an output matching means of an output stage; a common source transistor and a common gate transistor serially connected between the input matching means and the output matching means; a feedback resistor connected between the input matching means and the output matching means; and inductor connected between the common point of the common source transistor and common gate transistor and the output stage of the common gate transistor.

According to a fourth aspect of the present invention, there is provided a low noise amplifier comprising: an input matching means of an input stage and an output matching means of an output stage; a common source transistor and a common gate transistor serially connected between the input matching means and the output matching means; an inductor connected between a source and a ground of the common source transistor; and a resistor connected between the output stage and ground of the common source transistor.

According to a fifth aspect of the present invention, there is provided a low noise amplifier comprising: an input matching means of an input stage and an output matching means of an output stage; a common source transistor and a common gate transistor serially connected between the input matching means and the output matching means; a first inductor connected between a source and a ground of the common source transistor; and a second inductor connected between the common point of the common source transistor and common gate transistor and the output stage of the common gate transistor.

According to a sixth aspect of the present invention, there is provided a low noise amplifier comprising: an input matching means of an input stage and an output matching means of an output stage; a common emitter transistor and a common base transistor connected in serial between said input matching means and said output matching means; a first inductor connected between an emitter and a ground of said common emitter transistor; and a second inductor connected between the common point of said common emitter transistor and common base transistor and the output stage of said common base transistor.

According to a seventh aspect of the present invention, there is provided a low noise amplifier comprising: an input matching means of an input stage and an output matching means of an output stage; a common emitter transistor and a common base transistor connected in serial between said input matching means and said output matching means; an inductor connected between an emitter and ground of said common emitter transistor; and a resistor connected between the output stage and ground of said common base transistor.

BRIEF DESCRIPTION OF THE DRAWINGS

The above objects, and other features and advantages of the present invention will become more apparent by describing in detail a preferred embodiment thereof with reference to the attached drawings in which.

DETAILED DESCRIPTION OF PREFERRED EMBODIMENTS

Figure 8:
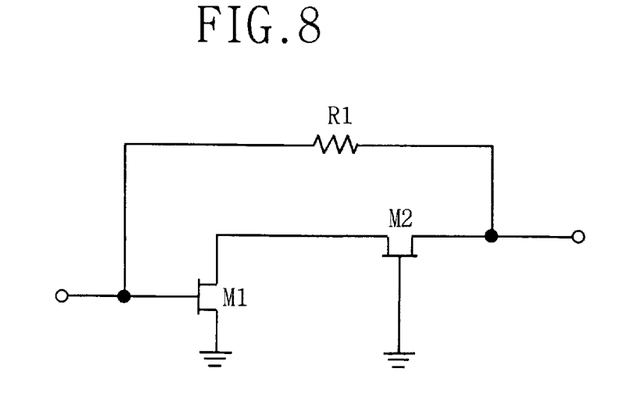
FIG. 8 is a circuit diagram of an active device of a low noise amplifier in accordance with a first embodiment of the present invention.

In FIG. 8, the active device of the low noise amplifier according to a first embodiment of the present invention is constituted by transistors M1 and M2 connected between a signal input and output stages in a cascode, and a feedback resistor R1 connected between the signal input and output stages. This is called a cascode resistive parallel feedback (CCPF) structure. This structure utilizes intrinsic advantages of the cascode structure, such as a higher gain, a wider bandwidth. Also, the advantages of the resistive parallel feedback structure having a better linearity, more stability and insensitivity against changes in parameters. Further, the noise and input stage power matching can be achieved by selecting the feedback resistor. The points of $\Gamma_{opt}$ (the optimum noise matching source reflectivity) and $G_{max}$ (the maximum available power gain matching source reflectivity) risen with the feedback resistance of 1.5KΩ are displayed in the Smith's chart shown in FIG. 9.

Figure 9:
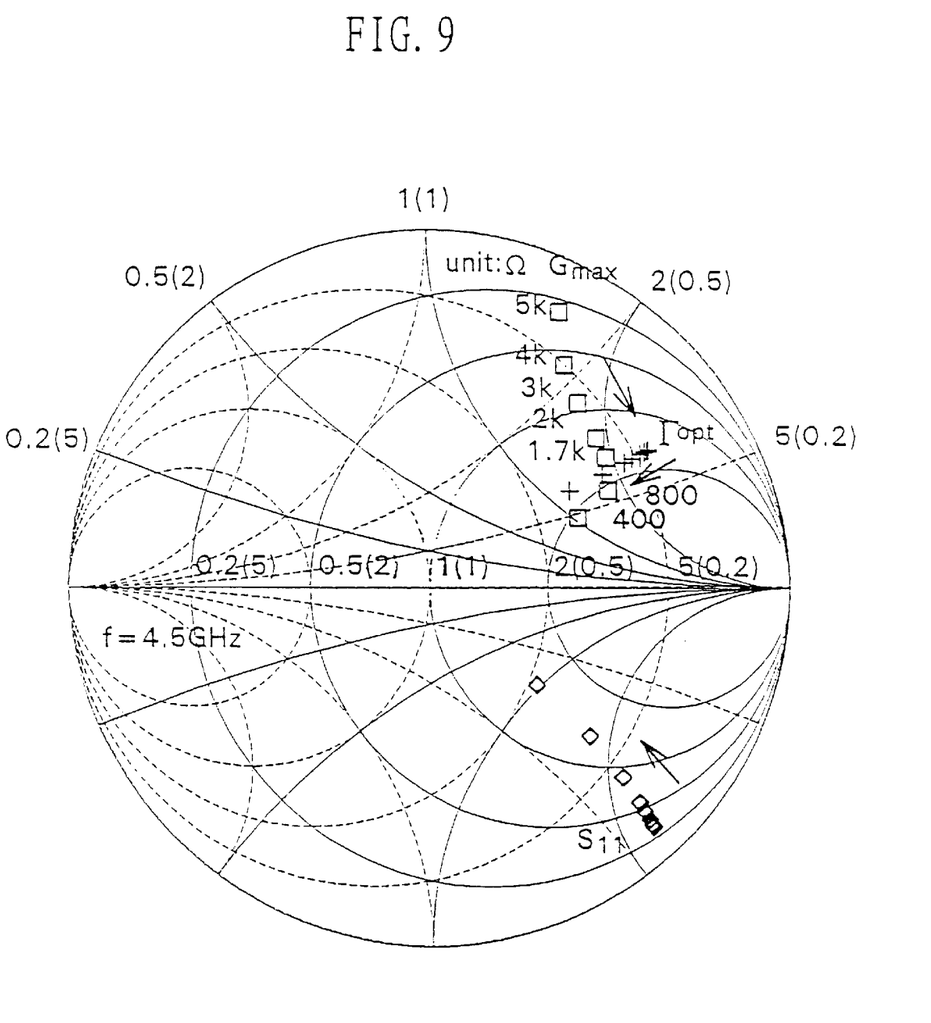
FIG. 9 is a Smith's chart showing points of $\Gamma_{opt}$, $G_{max}$ and $S_{11}$ depending a feedback resistor of a cascode resistive parallel feedback at 4.5GHz.

FIG. 9 shows points of $\Gamma_{opt}$ $G_{max}$ and $S_{11}$ depending on the feedback resistance of a cascode resistive parallel feedback at 4.5GHz. In FIG. 9, circles depicted by solid lines represent impedance circles, circles depicted by dot lines represent admittance circles, the values of the abscissa are real numerical values of the impedance and admittance, and the values along the circumference are imaginary numerical values thereof.

Figure 10:
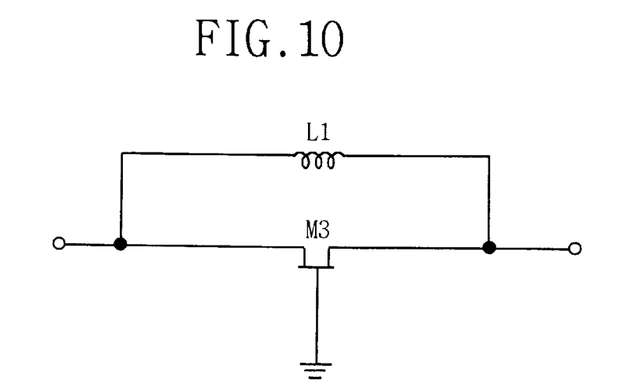
FIG. 10 is a circuit diagram of an active device of a low noise amplifier in accordance with a second embodiment of the present invention.
Figure 11:
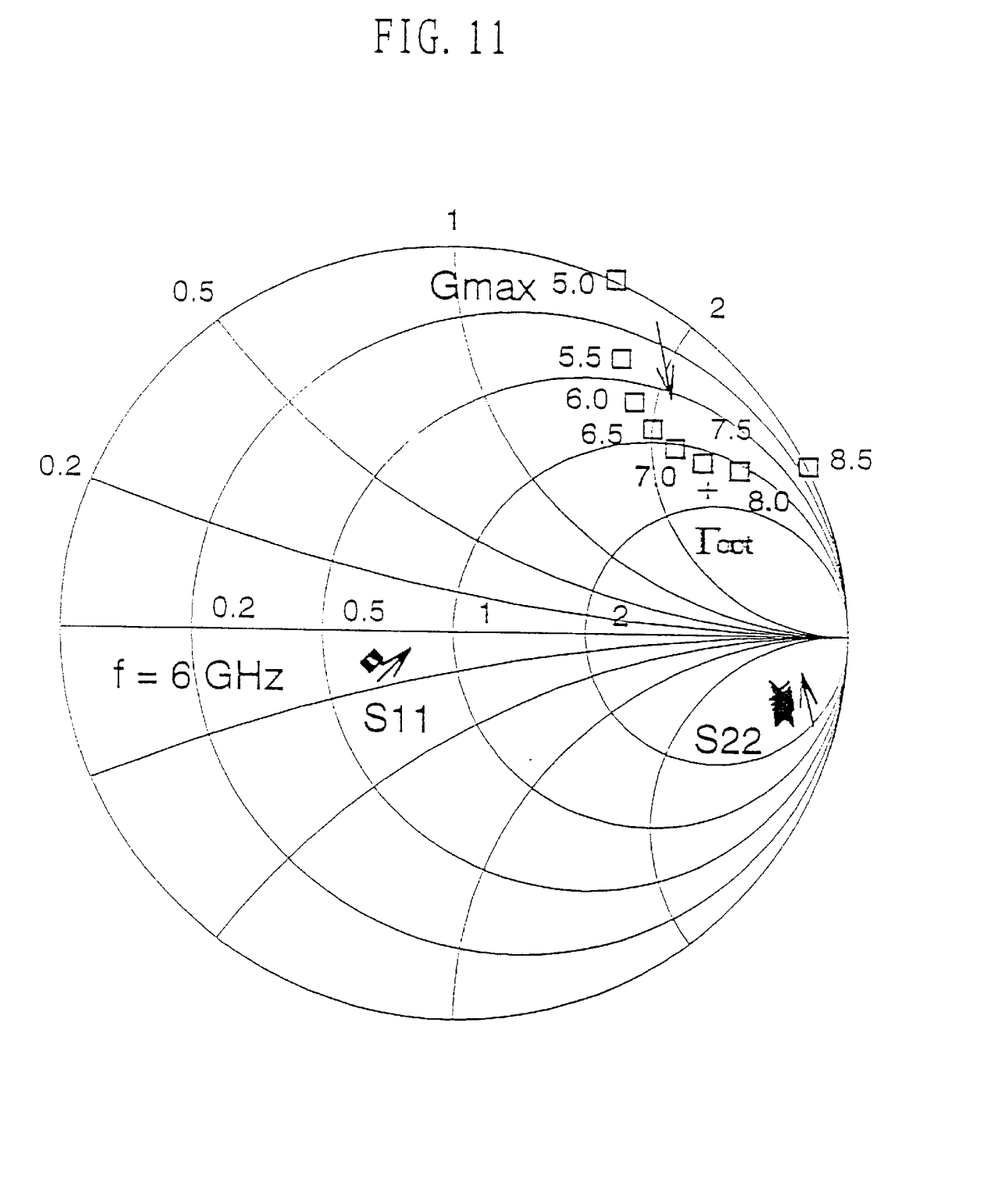
FIG. 11 is a Smith's chart showing points of $\Gamma_{opt}$, $G_{max}$ and $S_{11}$ depending on a feedback impedance of a common-gate inductive parallel feedback (CGPF) at 6GHz.

FIG. 10 is a circuit diagram of an active device for a low noise amplifier according to a second embodiment of the present invention, which is constituted by a transistor M3 between signal input and output stages and an inductor L1 connected between the input and output stages. This is called a common gate inductive parallel feedback CGPF structure. It is well known that CG has larger $NF_{min}$, smaller gain and poorer stability than CS and is not appropriate for the low noise amplifier. However, the inductive parallel feedback structure makes $NF_{min}$ smaller and gain larger, together with the unconditional stability. The inductive parallel feedback play a role to remove the capacitance $C_{ds}$ between drain and source. In addition, as shown in FIG. 11, $G_{max}$ can be made to be much closer to $\Gamma_{opt}$. The requested inductance figure is approximately given by $L_{fb} \equiv 1/(\omega C_{ds})$ where $\omega$ is angular frequency. Thus, the more the frequency and the width of the device is increased, the more this technique can be practical.

FIG. 11 shows impedance/admittance mapping of $\Gamma_{opt}$, and $G_{max}$ and points of $\Gamma_{opt}$, $G_{max}$ and $S_{11}$ depending on the feedback inductor of a common-gate inductive parallel feedback (CGPF) at 6GHz. In FIG. 11, circles depicted by solid lines represent impedance circles, the values of the abscissa are real numerical values of the impedance, and the values along the circumference are imaginary numerical values thereof. Rectangles are values of $G_{max}$ and a plus (+) sign represents a value of $\Gamma_{opt}$, respectively. From FIG. 11, it is understood that the points of $\Gamma_{opt}$ and $G_{max}$ are closest at the inductor (L) figure point of 7.5.

Figure 12:
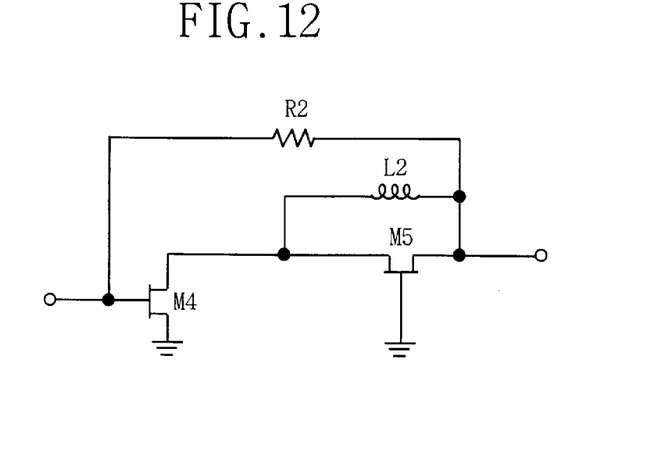
FIG. 12 is a circuit diagram of an active device of a low noise amplifier in accordance with a third embodiment of the present invention.

FIG. 12 is a circuit diagram of an active device for a low noise amplifier according to a third embodiment of the present invention, which is constituted by transistors M4 and M5 connected between an input stage and an output stage in a cascode, a resistor R2 connected between the input stage and the output stage, and an inductor L2 connected to the transistor M5 in parallel. The structure shown in FIG. 12 is one produced by combining advantages of CGPF and CCPF and is to be called a cascode resistive parallel feedback structure with a common-gate inductive parallel feedback (CCPF+CGPF). Also, this structure is more useful in a higher frequency (X band). This is because the noise contribution in the CGPF may be sharply reduced from the CG stage becoming greater as the frequency increases.

Figure 13:
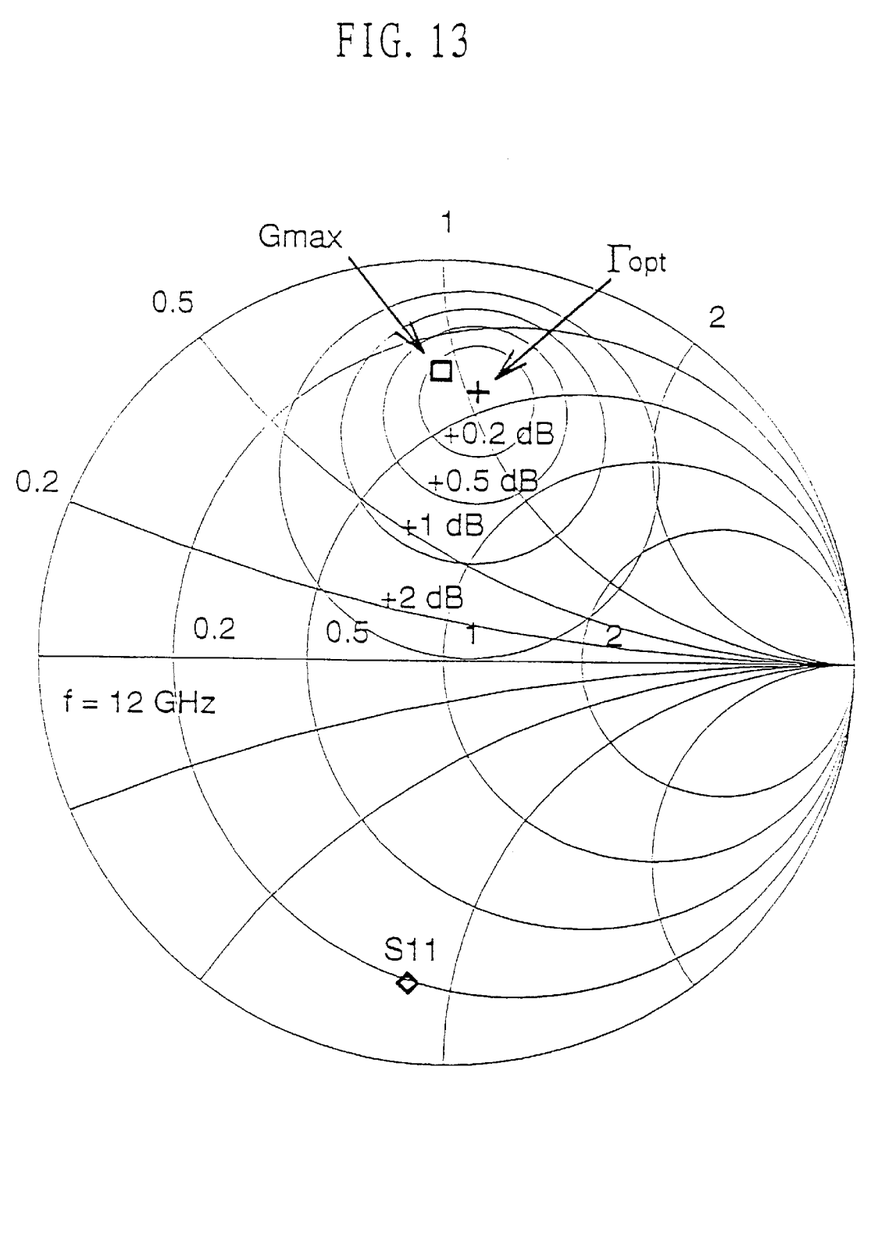
FIG. 13 is a Smith's chart showing circles of constant noise figures, and points of $G_{max}$ of CCPF+CGPF and $\Gamma_{opt}$ with respect to the 1.85nH local feedback inductance and 1.8KΩ wideband feedback resistance at 12GHz.

FIG. 13 shows circles of constant noise figures, and points of $G_{max}$ of CCPF+CGPF and $\Gamma_{opt}$ with respect to the 1.85nH local feedback inductance and 1.8KΩ wideband feedback resistance at 12GHz. In FIG. 13, circles depicted by solid lines represent impedance circles, the values of the abscissa are real numerical values of the impedance, and the values along the circumference are imaginary numerical values thereof. Rectangles represent values of $G_{max}$, plus (+) signs represent values of $\Gamma_{opt}$, and the circles centering at $\Gamma_{opt}$ represents noise figure circles, respectively.

Figure 14:
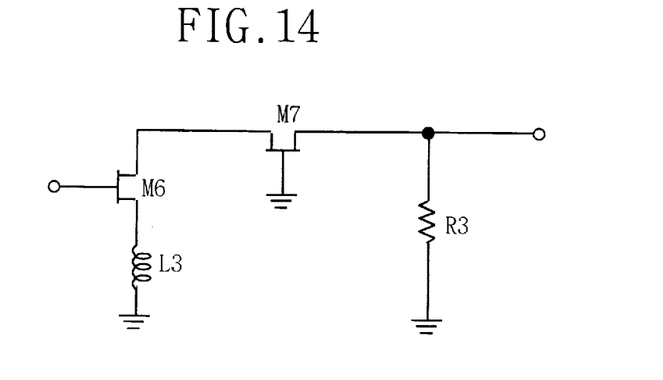
FIG. 14 is a circuit diagram of an active device of a low noise amplifier in accordance with a fourth embodiment of the present invention.

FIG. 14 is a circuit diagram of an active device for a low noise amplifier according to a fourth embodiment of the present invention, which is constituted by transistors M6 and M7 connected between an input stage and an output stage in a cascode, an inductor L3 connected between source and ground of the transistor M6, and a resistor R3 connected between the output stage and the ground. This is to be called a cascode inductive series feedback (CCSF) structure. It is reported that simultaneous matching of $\Gamma_{opt}$ and $S_{11}$* can be obtained by using the inductive series feedback and common source CS and the appropriate load, instead of $G_{max}$. However, the gain becomes considerably small due to a series feedback and small load impedance. Also, poor output VSWR is unavoidable. Further, as the frequency is increased, the $G_{max}$ points are quite different from $S_{11}$* due to $S_{12}$. The cascode can solve such problems because the gain of the cascode is far greater than that of the CS and the output load does not affect on the input matching due to much smaller $S_{12}$ of the cascode.

Figure 15:
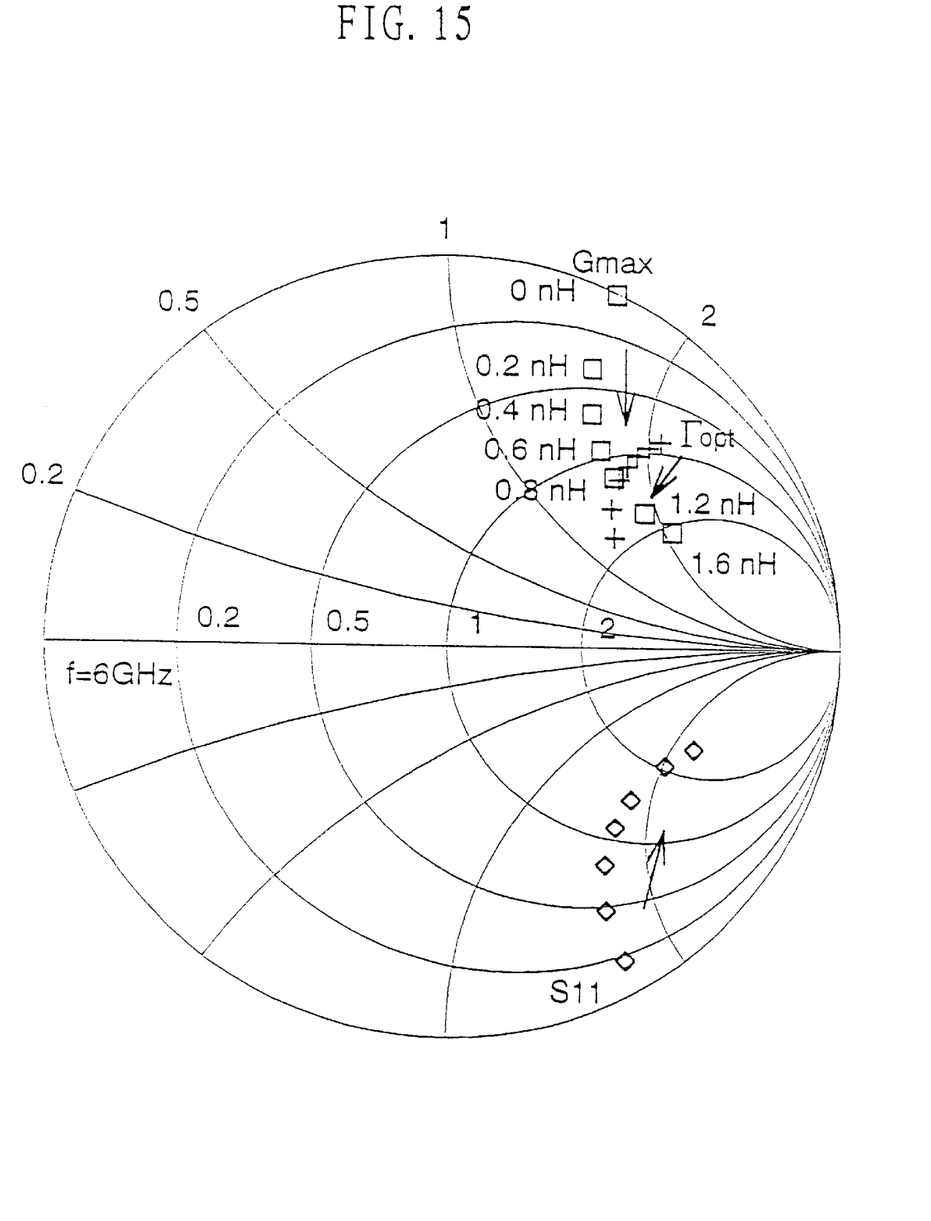
FIG. 15 is a Smith's chart showing points of $\Gamma_{opt}$, $G_{max}$ and $S_{11}$ with respect to a feedback inductor of CGSF at 6GHz.

FIG. 15 shows points of $\Gamma_{opt}$, $G_{max}$ and $S_{11}$ with respect to the feedback inductor of CGSF at 6GHz. In FIG. 15, circles depicted by solid lines represent impedance circles, the values of the abscissa are real numerical values of the impedance, and the values along the circumference are imaginary numerical values thereof. Rectangles represent values of $G_{max}$, and plus (+) signs represent values of $\Gamma_{opt}$, respectively. From FIG. 15, it is understood that the noise and input power simultaneousness matching occurs at 0.8nH series feedback.

Figure 16:
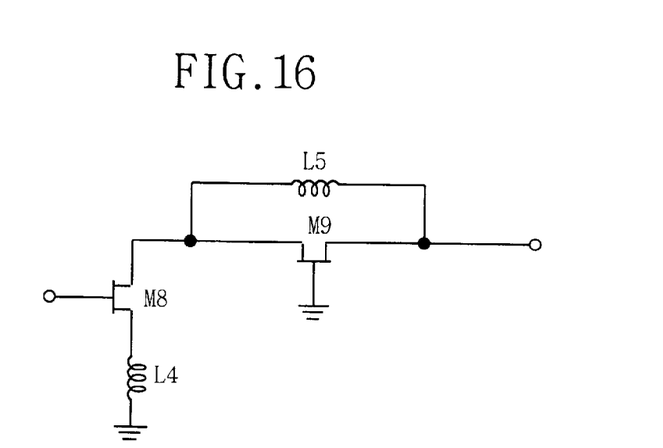
FIG. 16 is a circuit diagram of an active device of a low noise amplifier in accordance with a fifth embodiment of the present invention.

FIG. 16 is a circuit diagram of an active device for a low noise amplifier according to a fifth embodiment of the present invention, which is constituted by transistors M8 and M9 connected between an input stage and an output stage in a cascode, an inductor L4 connected between source and ground of the transistor M8, and an inductance L5 connected to the transistor M9 in parallel. This is produced by combining a common source inductive series feedback (CSSL) and a common gate inductive parallel feedback (CGPF) and is to be called a CSSL+CGPF structure. In other words, this structure is produced by utilizing the advantages of the common source inductive series feedback and a common gate inductive parallel feedback. That is to say, the noise and input power simultaneousness matching is obtained by inductive series feedback. Also, the minimum noise added from the common-gate (CG) stage and good stability can be obtained by the inductive parallel feedback.

Figure 17:
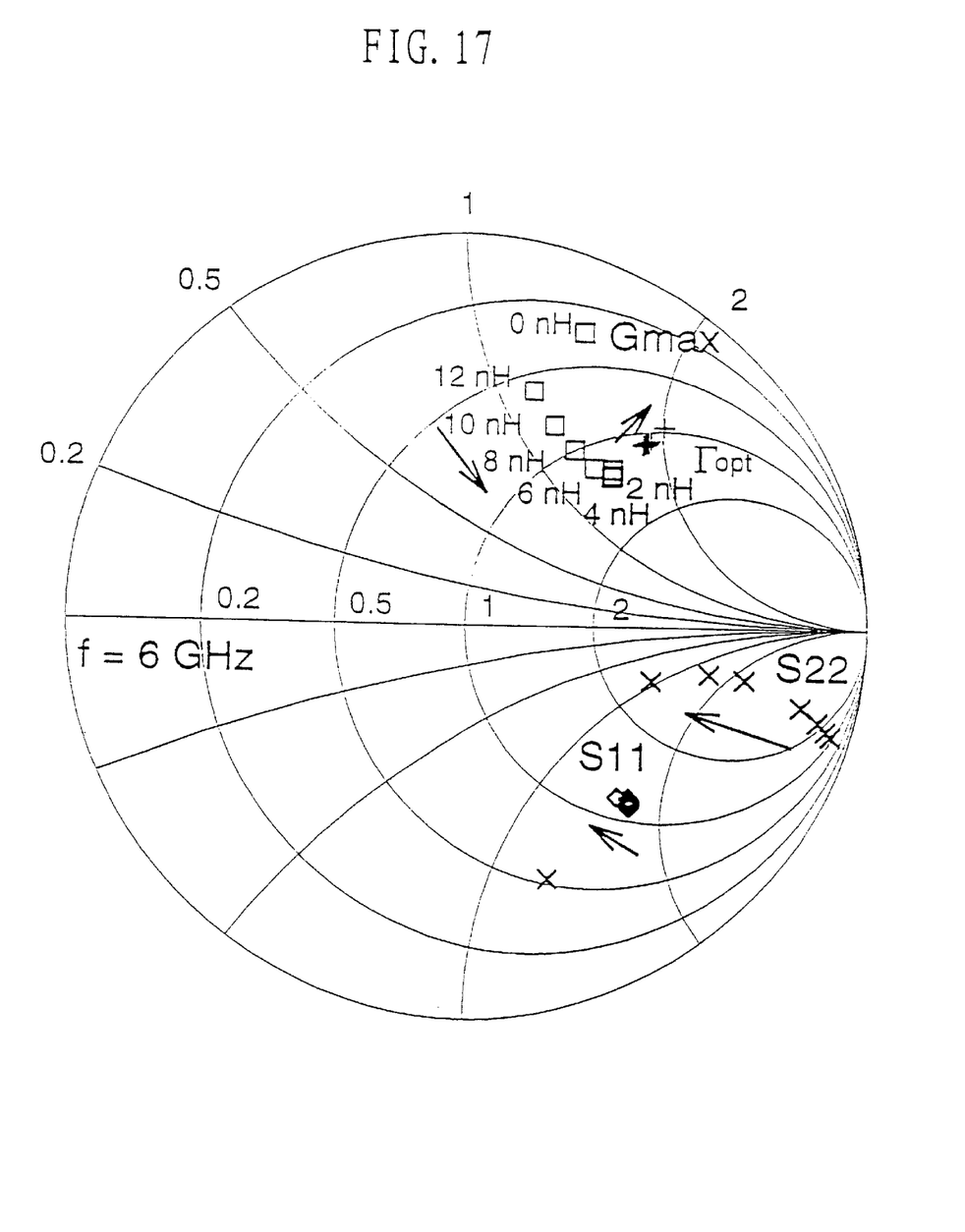
FIG. 17 is a Smith's chart showing points of $\Gamma_{opt}$, $G_{max}$ and $S_{11}$ depending on a short feedback inductance of a common gate port of CSSL+CGPL at 6GHz.

FIG. 17 shows points of $\Gamma_{opt}$, $G_{max}$ and $S_{11}$ depending on the short feedback inductance of a common gate stage of CSSL+CGPL at 6GHz. In FIG. 17, circles depicted by solid lines represent impedance circles, the values of the abscissa are real numerical values of the impedance, and the values along the circumference are imaginary numerical values thereof. Rectangles represent values of $G_{max}$, and plus (+) signs represent values of $\Gamma_{opt}$, respectively. From FIG. 17, it is understood that the points of $G_{max}$ and $\Gamma_{opt}$ are closest at 2nH–6nH.

Figure 18:
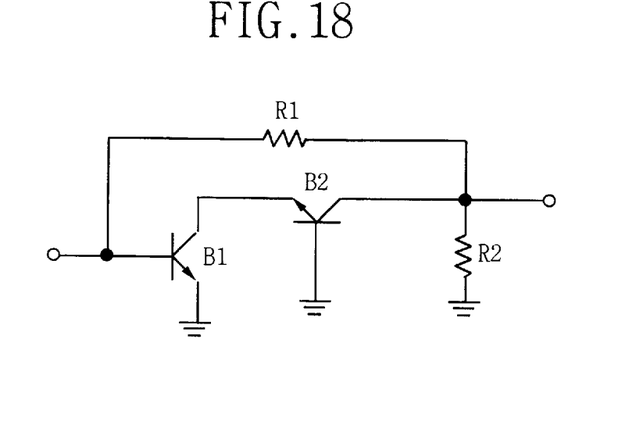
FIG. 18 is a circuit diagram of an active device of a low noise amplifier in accordance with a sixth embodiment of the present invention.
Figure 19:
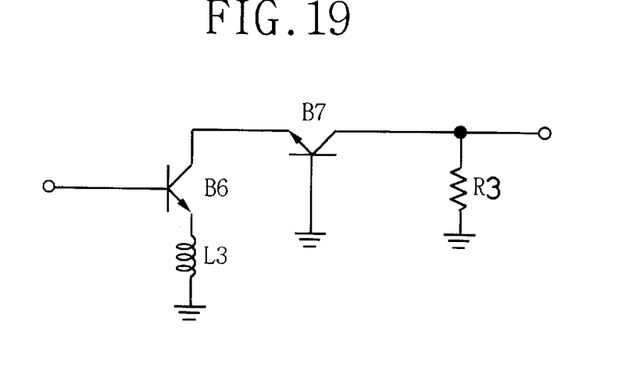
FIG. 19 is a circuit diagram of an active device of a low noise amplifier in accordance with a seventh embodiment of the present invention.
Figure 20:
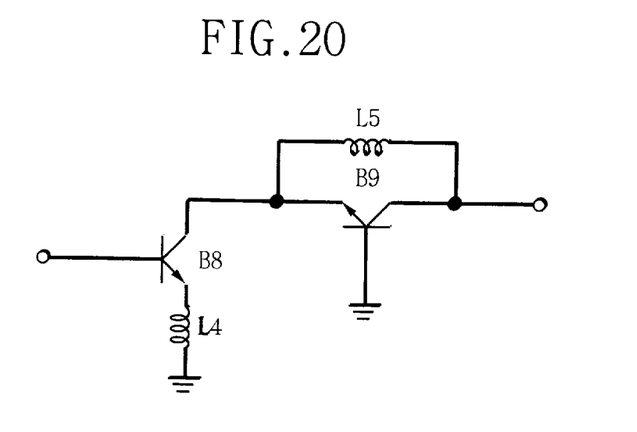
FIG. 20 is a circuit diagram of an active device of a low noise amplifier in accordance with a eighth embodiment of the present invention.

FIGS. 18 through 20 illustrate circuit diagrams which embody the CCPF, the CCSF and the NMOS transistor of the fifth embodiment into bipolar transistors, respectively.

Figure 2:
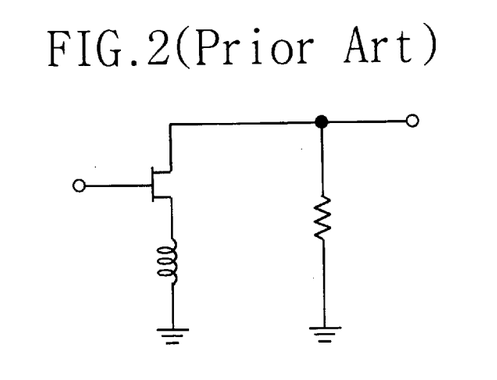
FIGS. 2 through 7 are circuit diagrams illustrating the constructions of conventional low noise amplifiers.
Figure 3:
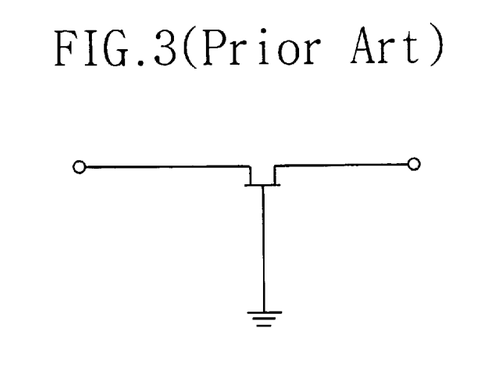
Figure 4:
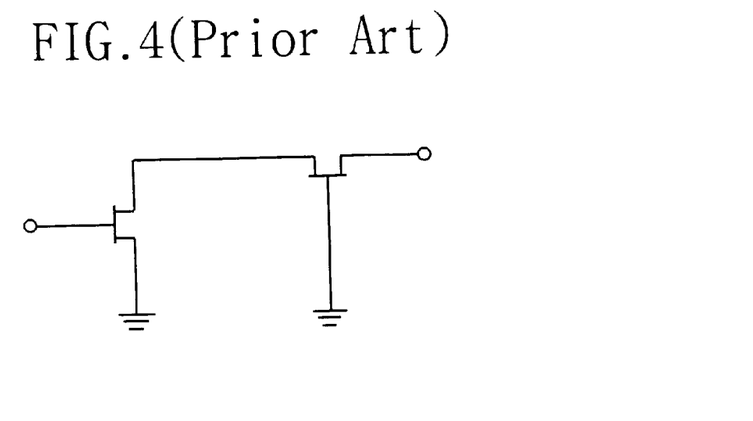
Figure 5:
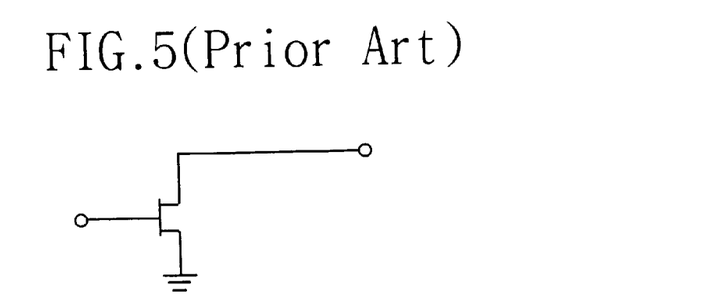
Figure 6:
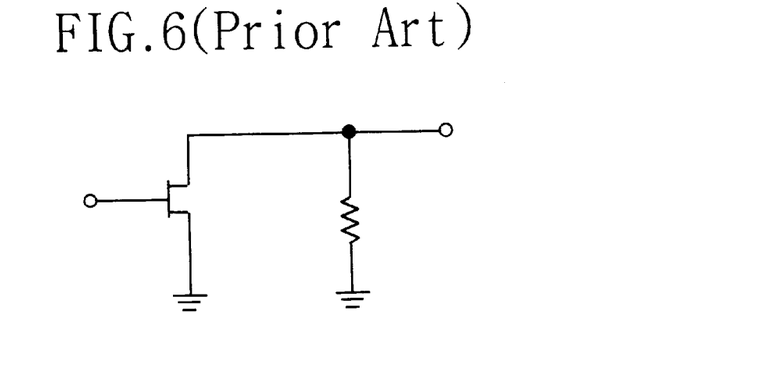
Figure 7:
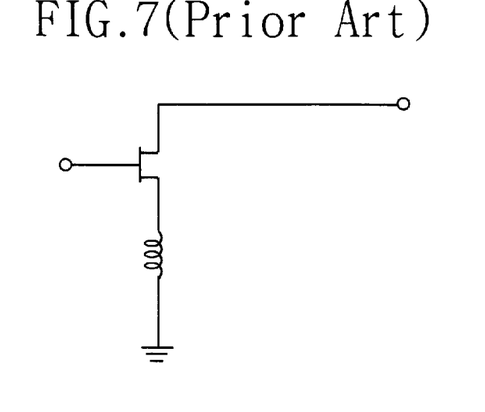

The following tables 1 to 3 show at 2($B=f_T/f=12$), 6($B=f_T/f=4$) and 12($B=f_T/f=2$) GHz the compared performances of the active device of the low noise amplifier according to the present invention in view of common-source (CS) structure (FIG. 2), common-source resistive load (CSRL) structure (FIG. 3), common-source inductive series feedback (CSSL) structure (FIG. 4), common-source inductive series feedback and resistive load (CSSF) structure (FIG. 5), common-gate (CG) structure (FIG. 6) and cascode structure (FIG. 7). When a selected device is a GaAs MESFET, it has $f_T$ value of 24 GHz, and when another selected device is a silicon npn bipolar transistor, it has $f_T$ value of 10 GHz. The items in each first row of the following table 1 to 3, show stability factor (K) for each structure, the maximum available power gain (MAG), the minimum noise figure NFmin, the minimum noise measure ($M_{min}$), and the input voltage standing wave ratio (VSWR) when the input noise is matched and the output gain is matched, respectively. These values are obtained by using an EEsof's simulator (EEsof's Libra™). Also, from the tables, it should be noted that the larger K than 1, the smaller $NF_{min}$, the smaller $M_{min}$ and the closer VSWR to 1, the better the low noise amplifier is.

TABLE 1

| Structure | K | MAG (dB) | $NF_{min}$ | $M_{min}$ | VSWR |
|---|---|---|---|---|---|
| CS | 0.133 | 17.343 | 0.570 | 0.144 | — |
| CSRL (10Ω) | 1.048 | 15.998 | 1.313 | 0.420 | 23.20 |
| CSSL (4 nH) | 1.004 | 12.625 | 0.543 | 0.144 | 3.35 |
| CSSF (4.2 nH & 600Ω) | 1.273 | 9.699 | 0.668 | 0.187 | 1.54 |
| CG | 0.963 | 9.370 | 0.526 | — | — |
| CGPF (75 nH) | 1.005 | 9.106 | 0.516 | 0.144 | 1.36 |
| cascode | 0.099 | 26.711 | 0.626 | — | — |
| CCSF (2.4 nH & 1.2KΩ) | 2.361 | 17.662 | 0.661 | 0.166 | 1.84 |
| CCPF (2KΩ) | 1.077 | 15.808 | 1.478 | 0.417 | 1.31 |
| CCPF + CGPF (2KΩ & 75 nH) | 1.082 | 15.655 | 1.477 | 0.417 | 1.33 |
| CSSL + CGPF (2 nH & 10 nH) | 1.599 | 17.472 | 0.610 | 0.154 | 1.45 |

TABLE 2

| Structure | K | MAG (dB) | $NF_{min}$ | $M_{min}$ | VSWR |
|---|---|---|---|---|---|
| CS | 0.274 | 12.604 | 0.870 | 0.244 | — |
| CSRL (20Ω) | 1.032 | 11.511 | 1.652 | 0.613 | 11.80 |
| CSSL (0.6 nH) | 1.018 | 10.712 | 0.836 | 0.244 | 3.80 |
| CSSF (0.6 nH & 100Ω) | 2.500 | 4.725 | 1.538 | 0.649 | 1.36 |
| CG | 0.741 | 8.251 | 0.921 | — | — |
| CGPF (7.5 nH) | 1.031 | 8.797 | 0.831 | 0.244 | 1.36 |
| cascode | 0.070 | 20.856 | 1.284 | — | — |
| CCSF (0.6 nH & 400KΩ) | 3.895 | 10.938 | 1.651 | 0.504 | 1.36 |
| CCPF (1.7KΩ) | 1.074 | 15.313 | 2.047 | 0.621 | 1/45 |
| CCPF + CGPF (1.8KΩ & 7.5 nH) | 1.185 | 13.903 | 1.986 | 0.605 | 1.42 |
| CSSL + CGPF (0.6 nH & 6 nH) | 2.287 | 14.527 | 1.375 | 0.387 | 1.84 |

TABLE 3

| Structure | K | MAG (dB) | $NF_{min}$ | $M_{min}$ | VSWR |
|---|---|---|---|---|---|
| CS | 0.496 | 9.780 | 1.320 | 0.437 | — |
| CSRL (50Ω) | 1.083 | 8.023 | 1.974 | 0.878 | 6.80 |
| CSSL (0.25 nH) | 1.031 | 8.420 | 1.313 | 0.437 | 3.10 |
| CSSF (0.25 nH & 150Ω) | 1.962 | 3.869 | 1.967 | 0.979 | 1.24 |
| CG | 0.438 | 6.401 | 1.722 | — | — |
| CGPF (1.85 nH) | 1.020 | 8.721 | 1.386 | 0.437 | 1.45 |
| cascode | −0.287 | 16.180 | 2.643 | — | — |
| CCSF (0.25 nH & 300KΩ) | 2.688 | 8.744 | 3.592 | 1.490 | 1.36 |
| CCPF ($R_{fb}$ = 700Ω & $R_L$ = 600Ω) | 1.324 | 9.576 | 3.812 | 1.580 | 1.00 |
| CCPF + CGPF (1.8KΩ & 1.85 nH) | 1.576 | 11.236 | 2.928 | 1.043 | 1.36 |
| CSSL + CGPF (0.2 nH & 1.4 nH) | 5.078 | 9.092 | 2.862 | 1.071 | 1.54 |

TABLE 4

| Structure | K | MAG (dB) | $NF_{min}$ | Rn | $M_{min}$ | VSWR |
|---|---|---|---|---|---|---|
| CE | 0.408 | 18.908 | 2.550 | 0.500 | 0.817 | — |
| CERL (60Ω) | 1.001 | 18.722 | 2.609 | 0.512 | 0.864 | 11.80 |
| CESL (1.3 nH) | 1.003 | 15.700 | 2.509 | 0.445 | 0.817 | 4.10 |
| CESF (1.6 nH & 200Ω) | 1.439 | 11.500 | 2.564 | 0.451 | 0.868 | 1.45 |
| CB | 0.215 | 16.977 | 2.614 | 0.501 | — | |
| cascode | −1.351 | 35.885 | 2.628 | 0.505 | | |
| CCSF (1 nH & 600Ω) | 6.045 | 22.991 | 2.648 | 0.470 | 0.844 | 1.54 |
| CCPF ($R_{fb}$ = 4KΩ & $R_L$ = 1.7KΩ) | 1.107 | 22.227 | 2.722 | 0.506 | 0.873 | 1.24 |
| CESL + CBPL (0.8 nH & 5 nH) | 2.795 | 18.795 | 2.609 | 0.472 | 0.835 | 1.24 |

From the above tables, it is understood that the minimum noise characteristic, i.e., $NF_{min}$ of CCPF shown in FIG. 9, is slightly increased at a drain node together with a stabilizing resistance, compared to a simple circuit structure such as the CS structure. This is because of the noise added from the feedback resistance and the common gate CG at the high frequency (C and X bands) and that added from the feedback resistance at the low frequency (L band). In order to reduce $NF_{min}$ of CCPF, a much greater matching resistance should be used or the noise added from CG stage should be reduced considering the interstage matching between CS and CG. Thus, the structures shown in FIGS. 10 and 12 are produced.

It is well known that CG has greater $NF_{min}$, smaller gain, poorer stability than CS. However, the inductive parallel feedback structure makes $NF_{min}$ smaller and gain larger, together with unconditional stability. The inductive parallel feedback play a role to remove the capacitance between drain and source $C_{ds}$. Further, as shown in FIG. 11, $G_{max}$ can be made to be much closer to $\Gamma_{opt}$. The requested inductance figure is roughly given by $L_{fb} = 1/(\omega^2 C_{ds})$ where ω represents an angular frequency. Thus, the structure shown in FIG. 10 can be more practical as the frequency is increased and the gate width of the device is increased. The normalized noise resistance of CGPF is smaller than that of CS. This means that the radii of the circles having constant noise characteristics of CGPF are larger, which allows CGPF to offer excellent noise measuring performance together with the simultaneous noise, input power matching and unconditional stability (to be referable to table 1 to 3). However, the producibility of the structure is a key point due to comparatively great variation of $C_{ds}$, and the output power matching is rather difficult due to large output impedance.

In addition to the reduction of $NF_{min}$ of the CG stage, the local inductive parallel feedback structure allows the use of much greater feedback resistance for the simultaneous matching, as shown in the table 3. The minimum noise measure $M_{min}$ of the CCPF+CGPF structure is much lower than that of the CCPF structure at 12GHz.

The minimum noise measure $M_{min}$ of the CCSF+CCPF structure is much smaller than that of the CSSF structure at 2 and 6GHz, together with the CSSF structure, but is not like that at 12GHz. This is because the noise added from the CG stage is more increased according to the increase of the frequency. The structure for reducing the noise is shown in FIG. 16. The $M_{min}$ of this structure is very excellent in all the microwave ranges. However, the disadvantages of this structure are in that two inductors are required and a chip size is considerably increased accordingly.

As the result, though the respective structure is good enough to be used as the low noise frequency active device, each has some disadvantages.

Now, let us consider which structure is the most appropriate with respect to a given frequency band, i.e., L (2GHz), C (6GHz) and X (12GHz) bands.

Figure 21:
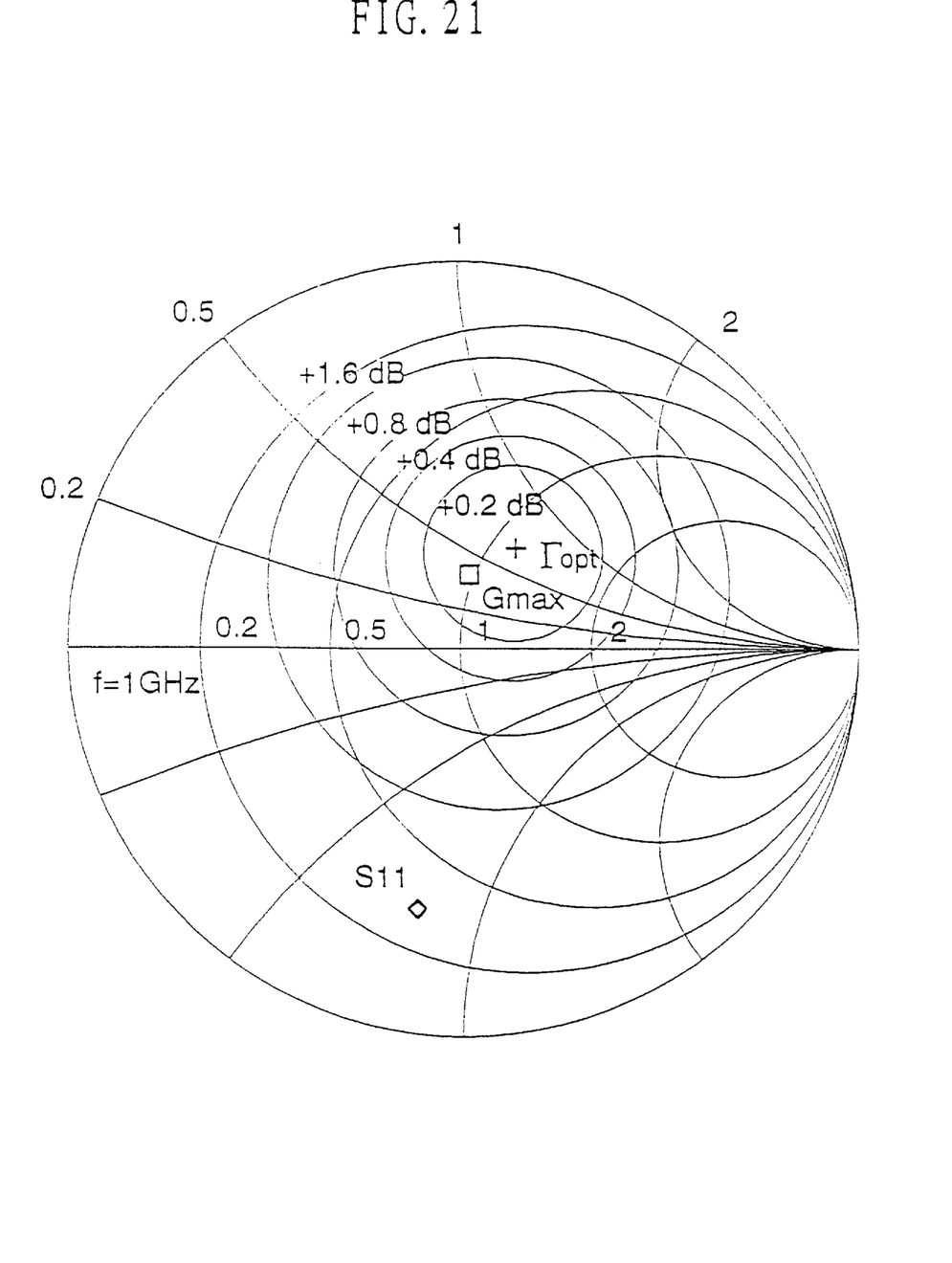
FIG. 21 is a Smith's chart showing points of $G_{max}$ of CCPF+CGPF and $\Gamma_{opt}$, and circles of constant noise figures with respect to the 4K Ω feedback resistance and 1.7KΩ load resistance at 1 GHz

First, with respect to the L band, the structure having the VSWR characteristic smaller than 2 with the smallest $M_{min}$ in the Table 1 is the CGPF structure. However, in this structure, the requested inductance is 75nH, which is too large to be embodied by a monolithic type. The candidates having the next smallest $M_{min}$ are the CSSL+CGPF and CCSF structures, each having a similar minimum noise measure performance. Considering the bandwidth, linearity, stability and insensitivity to the parameter change, although these structures have a slightly larger $NF_{min}$, the CCPF and CCPF+CGPF structures are also reasonably good techniques. As a whole, when a 0.5 μm MESFET is used, the CCSF and CSSL+CGPF structures seem to be the best choice. For an LNA adopting an NPN type BJY, the $M_{min}$ of the CCPF structure is almost the same as those of others. This is because the increase in the $MF_{min}$ is negligible due to the large gain and the large feedback resistance of the CE stage. Further, the points of $\Gamma_{opt}$ and $G_{max}$ are close to 50Ω as shown in FIG. 21. Thus, the CCPF structure is the best for the application of the L band using the silicon NPN type BJT(see Table 4).

Next, with respect to C and X bands, in Tables 2 and 3, the structure having the VSWR smaller than 2 and the lowest $M_{min}$ is the CGPF structure, where the requested inductance values are 7.5nH and 1.85nH at 6GHz and 12GHz, respectively, to thereby be embodied by the monolithic type. The CSSL+CGPF, CCSF, CCPF and CCPF+CGPF structures exhibit considerably good noise measurements together with the unconditional stability and producibility. Particularly, in the X band, among the structures using the cascode, the CCPF+CGPF and CSSL+CGPF structures exhibit better noise measure performances than the CCSF and CCPF structures. This means that the common-gate inductive parallel feedback plays an important role in increasing the noise measure performance at a higher frequency. In conclusion, if the unity for the Cds figure and feedback inductance is properly maintained, the CGPF structure is the best one at 6GHz and 12GHz, in view of the noise measurement performance as well as the noise and input power simultaneousness matching and unconditional stability. In addition to the CGPF structure, the CSSL+CGPF structure is the best one at 6GHz, and the CCPF+CGPF and CSSL+CGPF structures are the best ones at 12GHz. This is because the noise performance is not sensitive to the change in the feedback inductance in the CCPF+CGPF nor CSSL+CGPF structure, while being sensitive in the CGPF structure.

Therefore, the low noise amplifier according to the present invention allows the points of $\Gamma_{opt}$ and $G_{max}$ to be closer to each other so that the noise and input gain simultaneousness matching is performed, thereby improving the performance.

While the present invention has been described and illustrated with reference to preferred embodiments thereof, it is to be readily understood by those skilled in the art that the present invention is not limited to the embodiments, and various changes and modifications can be made therein without departing from the spirit and scope of the invention defined in the appended claims.

What is claimed is:

1. A low noise amplifier comprising:

an input matching means of an input stage and an output matching means of an output stage;

a common source transistor and a common gate transistor serially connected between said input matching means and said output matching means;

a feedback resistor connected between said input matching means and said output matching means; and an inductor connected between the common point of said common source transistor and common gate transistor and said output matching means.

2. A low noise amplifier comprising:

an input matching means of an input stage and an output matching means of an output stage;

a common source transistor and a common gate transistor serially connected between said input matching means and said output matching means;

a first inductor connected between a source and a ground of said common source transistor; and a second inductor connected between the common point of said common source transistor and common gate transistor and said output matching means.

3. A low noise amplifier comprising:

an input matching means of an input stage and an output matching means of an output stage;

a common emitter transistor and a common base transistor connected in serial between said input matching means and said output matching means;

a first inductor connected between an emitter and a ground of said common emitter transistor; and a second inductor connected between the common point of said common emitter transistor and common base transistor and said output matching means.

* * * * *

UNITED STATES PATENT AND TRADEMARK OFFICE
CERTIFICATE OF CORRECTION

PATENT NO. : 5,926,069
DATED : July 20, 1999
INVENTOR(S) : Ko et al.

It is certified that error appears in the above-identified patent and that said Letters Patent is hereby corrected as shown below:

<u>Column 1,</u>
Line 27, "Nfrnin" should read -- Nfmin --.
Line 27, "rpt" should read -- Gopt --.
Line 34, "gain GA," should read -- gain (GA), --.

<u>Column 5,</u>
Line 10, "(wCds)" should read -- (w2Cds) --.

<u>Column 6,</u>
Line 60, "NFmin" should read -- NFmin --.

<u>Table 2,</u>
Row 11, column 6, "1/45" should read -- 1.45 --.

<u>Column 8,</u>
Line 29, "CO" should read -- w --.

<u>Column 9,</u>
Line 9, "BJY" should read -- BJT --.

Signed and Sealed this

Eighth Day of October, 2002

Attest:

JAMES E. ROGAN
Attesting Officer     Director of the United States Patent and Trademark Office